(12) United States Patent
Ootorii

(10) Patent No.: US 10,965,831 B2
(45) Date of Patent: Mar. 30, 2021

(54) OPTICAL HEAD, OPTICAL HEAD SCANNING DEVICE, AND METHOD FOR DRIVING OPTICAL HEAD SCANNING DEVICE

(71) Applicant: SONY SEMICONDUCTOR SOLUTIONS CORPORATION, Kanagawa (JP)

(72) Inventor: Hiizu Ootorii, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/613,893

(22) PCT Filed: Mar. 19, 2018

(86) PCT No.: PCT/JP2018/010839
§ 371 (c)(1),
(2) Date: Nov. 15, 2019

(87) PCT Pub. No.: WO2018/216330
PCT Pub. Date: Nov. 29, 2018

(65) Prior Publication Data
US 2020/0186664 A1    Jun. 11, 2020

(30) Foreign Application Priority Data
May 25, 2017    (JP) .............................. JP2017-103721

(51) Int. Cl.
*H04N 1/03*    (2006.01)
*H05B 45/50*    (2020.01)

(52) U.S. Cl.
CPC ........... *H04N 1/0303* (2013.01); *H05B 45/50* (2020.01); *H04N 2201/02462* (2013.01)

(58) Field of Classification Search
CPC ......... H01L 2924/0002; H01L 2924/00; H01L 21/76816; H01L 23/485; H01L 23/522;
(Continued)

(56) References Cited

U.S. PATENT DOCUMENTS 5,652,067 A  *  7/1997  Ito .................... H01L 51/5048
                                                       313/500
5,693,962 A  *  12/1997  Shi .................... H01L 27/3211
                                                       257/89
(Continued)

FOREIGN PATENT DOCUMENTS

CN          1467580 A          1/2004
CN          101542854 A        9/2009
(Continued)

OTHER PUBLICATIONS

International Search Report and Written Opinion of PCT Application No. PCT/JP2018/010839, dated May 1, 2018, 13 pages of ISRWO.

(Continued)

*Primary Examiner* — Negussie Worku
(74) *Attorney, Agent, or Firm* — Chip Law Group

(57) ABSTRACT

Provided is an optical head that includes a base substrate and a line head. The line head includes a plurality of sub-line heads electrically independent of one another and arranged on the base substrate in parallel with a first direction. Each of the plurality of sub-line heads includes a circuit substrate unit that constitutes a portion of the base substrate, and an optical-element array that includes a plurality of optical elements each arranged on the circuit substrate unit at least in parallel with a second direction that is a direction of a length of each of the plurality of sub-line heads.

13 Claims, 15 Drawing Sheets

(58) Field of Classification Search
CPC ........... H01L 27/1052; H01L 27/11529; H01L 27/11531; G02B 6/26; G02B 6/32; G02B 6/322; G02B 6/3652; G02B 6/3672; G02B 6/3829; G02B 6/3839; G02B 6/3853; G02B 6/3885; G02B 6/4206; G02B 6/4214; G02B 6/4249; H04N 2005/2255; H04N 5/2256; H04N 5/3742; H04N 5/37455; H04N 5/37457; H04N 5/378; H04N 5/379; H04N 1/0306; H04N 1/0312; H04N 1/0315; H04N 1/0318; H04N 1/10
USPC .......................................... 358/474, 482, 483
See application file for complete search history.

(56) References Cited

U.S. PATENT DOCUMENTS

| | | | | |
|---|---|---|---|---|
| 5,736,754 | A * | 4/1998 | Shi | H01L 27/3281 257/89 |
| 6,297,842 | B1 * | 10/2001 | Koizumi | B41J 2/45 257/88 |
| 7,175,712 | B2 * | 2/2007 | Siegel | B41F 23/0409 118/620 |
| 9,207,413 | B2 * | 12/2015 | Bylander | G02B 6/4214 |
| 2004/0036011 | A1 * | 2/2004 | Jones | H04N 1/12 250/208.1 |
| 2004/0075758 | A1 | 4/2004 | Nomura et al. | |
| 2012/0305946 | A1 | 12/2012 | Kuk et al. | |
| 2012/0307030 | A1 * | 12/2012 | Blanquart | H01L 27/14601 348/76 |
| 2013/0135694 | A1 | 5/2013 | Yamamura | |
| 2013/0277696 | A1 * | 10/2013 | Matsui | H01L 33/42 257/96 |
| 2013/0300308 | A1 | 11/2013 | Sadwick | |
| 2014/0193116 | A1 * | 7/2014 | Bylander | G02B 6/4249 385/33 |
| 2019/0103409 | A1 * | 4/2019 | Xu | H03K 19/17736 |
| 2019/0113741 | A1 * | 4/2019 | Kito | G02B 26/10 |
| 2019/0296140 | A1 * | 9/2019 | Yoshimochi | H01L 21/0262 |
| 2019/0299592 | A1 * | 10/2019 | Iwasaki | B41J 2/17596 |

FOREIGN PATENT DOCUMENTS

| | | |
|---|---|---|
| CN | 101654023 A | 2/2010 |
| DE | 69506655 T2 | 7/1999 |
| EP | 0704915 A1 | 4/1996 |
| EP | 1366920 A1 | 12/2003 |
| EP | 1564007 A1 | 8/2005 |
| EP | 1564008 A1 | 8/2005 |
| JP | 59-098879 A | 6/1984 |
| JP | 60-068976 A | 4/1985 |
| JP | 08-090832 A | 4/1996 |
| JP | 08-90832 A | 4/1996 |
| JP | 2003-341141 A | 12/2003 |
| JP | 2004-230879 A | 8/2004 |
| JP | 2004-287292 A | 10/2004 |
| JP | 2007-147846 A | 6/2007 |
| JP | 2007-203633 A | 8/2007 |
| JP | 2009-154420 A | 7/2009 |
| JP | 2012-247565 A | 12/2012 |
| JP | 2013-111786 A | 6/2013 |
| JP | 2015-120261 A | 7/2015 |
| WO | 2011/097694 A1 | 8/2011 |

OTHER PUBLICATIONS

Office Action for CN Patent Application No. 2018800327664 dated Nov. 20, 2020, 13 pages of Office Action and 14 pages of English Translation.

* cited by examiner

US 10,965,831 B2

OPTICAL HEAD, OPTICAL HEAD SCANNING DEVICE, AND METHOD FOR DRIVING OPTICAL HEAD SCANNING DEVICE

CROSS REFERENCE TO RELATED APPLICATIONS

This application is a U.S. National Phase of International Patent Application No. PCT/JP2018/010839 filed on Mar. 19, 2018, which claims priority benefit of Japanese Patent Application No. JP 2017-103721 filed in the Japan Patent Office on May 25, 2017. Each of the above-referenced applications is hereby incorporated herein by reference in its entirety.

TECHNICAL FIELD

The present technology relates to an optical head that includes an optical-element array, an optical head scanning device that includes the optical head, and a method for driving the optical head scanning device.

BACKGROUND ART

The modeling apparatus disclosed in Patent Literature 1 includes, for example, a rotatable work plate, an exposure head unit, and a drum. This modeling apparatus uses a transparent drum having a curved surface as a mechanism that regulates a liquid level of a light-curable resin during modeling. The exposure head unit (an irradiation unit) includes a one-dimensional LED (light-emitting diode) array as a plurality of solid-state light-emitting elements (for example, refer to paragraph [0037] of the specification and FIG. 2).

The optical scanning device disclosed in Patent Literature 2 includes a semiconductor laser in which a surface light-emitting VCSEL (Vertical Cavity Surface Emitting Laser-diode) that includes a plurality of laser light-emitting sections, is adopted as the semiconductor laser (for example, refer to paragraph [0058] of the specification, and FIGS. 1, 3, and 4).

CITATION LIST

Patent Literature

Patent Literature 1: Japanese Patent Application Laid-open No. 2015-120261
Patent Literature 2: Japanese Patent Application Laid-open No. 2004-287292

DISCLOSURE OF INVENTION

Technical Problem

When an optical head is produced that includes a plurality of light-emitting elements, there is a need to produce a product in which all of the light-emitting elements are non-defective, that is, a product without a dead pixel. However, in recent years, there is a need to implement a light-emitting element at a more accurate position due to a pitch of dots being made narrower, which results in the difficulty in production. Consequently, there occurs a problem in a reduction in yield rate.

An object of the present disclosure is to provide an optical head, an optical head scanning device, and a method for driving the optical head scanning device, the optical head and the optical head scanning device making it possible to achieve more accurate positioning of dots and to increase a production yield rate while maintaining non-defectiveness.

Solution to Problem

In order to achieve the object described above, an optical head according to an embodiment includes a base substrate and a line head.

The line head includes a plurality of sub-line heads electrically independent of one another and arranged on the base substrate in parallel with a first direction.

Each of the plurality of sub-line heads includes a circuit substrate unit that constitutes a portion of the base substrate, and an optical-element array that includes a plurality of optical elements each arranged on the circuit substrate unit at least in parallel with a second direction that is a direction of a length of each of the plurality of sub-line heads.

Since a plurality of sub-line heads is arranged in parallel with a first direction, for example, the plurality of sub-line heads can be virtually used as one line head. In other words, even if a defect occurs in an optical element, such a defect can be complemented among the plurality of sub-line heads. This results in being able to increase a production yield rate while maintaining non-defectiveness in an optical head that is an end product. Further, since an optical-element array is arranged on a circuit substrate unit constituting a portion of a base substrate, it is possible to achieve more accurate positioning of dots with respect to the optical-element array.

The optical-element array may be configured such that the plurality of optical elements is provided in a staggered arrangement. This makes it possible to, for example, design a lens having a larger diameter, compared to the case of arranging a plurality of optical elements only in the second direction.

The circuit substrate unit may include a plurality of driver substrate elements each arranged in parallel with the second direction correspondingly to each of the plurality of optical elements.

The circuit substrate unit may include a plurality of driver substrate elements each arranged in parallel with the second direction correspondingly to each of the plurality of optical elements. Each of the plurality of driver substrate elements may be formed to be long in the first direction.

The base substrate may be constituted of a semiconductor substrate, and the plurality of driver substrate elements may be integrated with the semiconductor substrate.

An accurate circuit substrate unit is formed by a semiconductor manufacturing process.

The line head may include a lens array that includes a plurality of lenses each arranged at a position corresponding to each of the plurality of optical elements. In other words, a lens array is provided in a state in which a plurality of optical elements is provided in a non-orthogonal matrix arrangement.

This makes it possible to design the lenses each having a large diameter, which results in an increase in an amount of light passing through each of the lenses.

A plurality of the lens arrays may be provided and constitute a collimating optical system.

Alternatively, the line head may include a lens array that is arranged on the plurality of optical elements and includes a gradient index lens.

The optical head may further include an interface that is configured such that data indicating at least one optical element to be invalidated from among the plurality of optical elements is input to each of the circuit substrate units.

For example, this enables an optical head scanning device to vertically use a plurality of sub-line heads as one line head. In other words, an optical head scanning device can control an optical head such that a defect occurring in each optical element is complemented among the plurality of sub-line heads.

A plurality of the line heads may be provided and constitute a surface light-emitting portion or a surface light-reception portion.

This results in, for example, an improvement in a processing speed of an optical head scanning device that scans an optical head.

An optical head scanning device according to an embodiment includes the optical head, a scanning mechanism, and a controller.

The scanning mechanism scans the optical head in parallel with the first direction.

The controller controls driving of the optical head and the scanning mechanism using data indicating at least one optical element to be invalidated from among the plurality of optical elements, such that the plurality of sub-line heads is virtually used as one line head.

This enables an optical head scanning device to drive an optical head and a scanning mechanism such that a defect occurring in each optical element is complemented among a plurality of sub-line heads.

The controller may be configured to use a normal optical element arranged at a position identical, in the second direction, to a position of a defective optical element of a first sub-line head from among the plurality of sub-line heads, the normal optical element being an optical element of the second sub-line head.

A method for driving the optical head scanning device includes generating data indicating at least one optical element to be invalidated from among the plurality of optical elements.

Driving of the optical head and the scanning mechanism is controlled using the acquired data, such that the plurality of sub-line heads is virtually used as one line head.

Advantageous Effects of Invention

As described above, the present technology makes it possible to achieve more accurate positioning of dots and to increase a production yield rate of an optical head while maintaining non-defectiveness.

Note that the effect described here is not necessarily limitative and may be any effect described in the present disclosure.

MODE(S) FOR CARRYING OUT THE INVENTION

Embodiments according to the present technology will now be described below with reference to the drawings.

1. Optical Head

Figure 1:
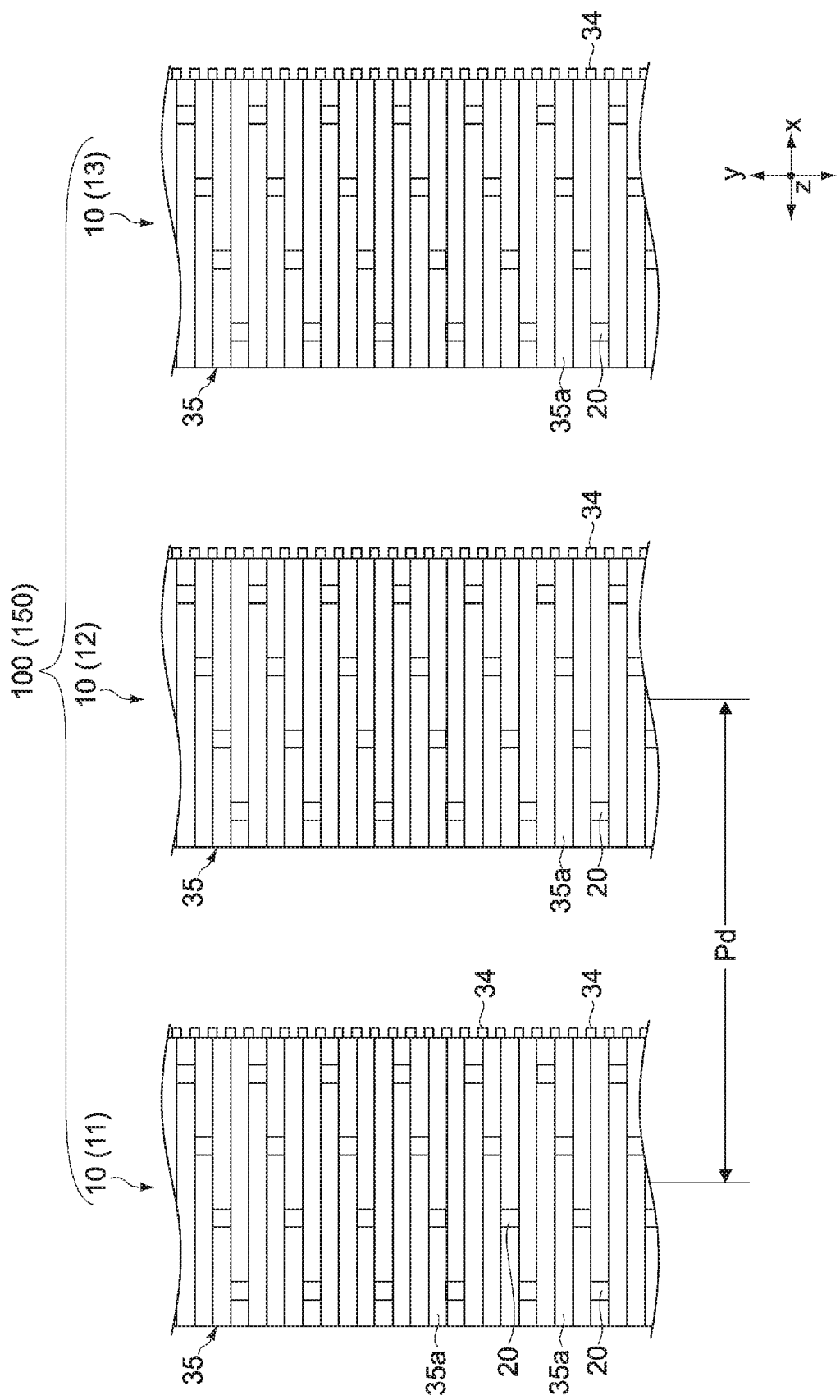
FIG. 1 is a plan view of a portion of a line head included in an exposure head according to an embodiment.

In the following description, an exposure head that includes a light-emitting element 20 is described as an optical head according to an embodiment of the present technology. FIG. 1 is a plan view of a portion of a line head 100 included in the exposure head 150. The line head 100 is long in a vertical direction (referred to as a y direction) in the figure.

The line head 100 includes a plurality of sub-line heads 10 arranged in parallel with an x direction (a first direction) that is a horizontal direction. The sub-line heads 10 of the plurality of sub-line heads 10 are provided electrically independently of one another in the exposure head 150.

Figure 2:
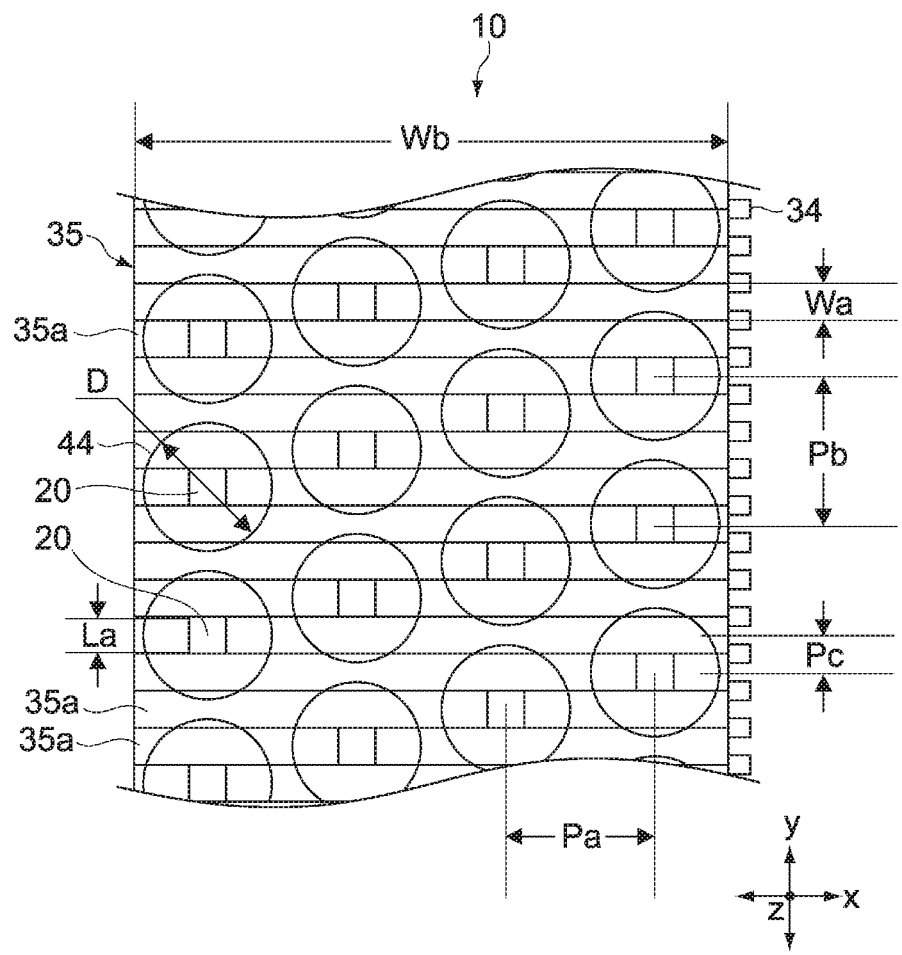
FIG. 2 is a plan view of an enlarged portion of a sub-line head.

For example, the line head 100 includes three sub-line heads 10 (11, 12, and 13). Since these three sub-line heads 10 have substantially the same structure, the structure of one of the sub-line heads 10 is described. FIG. 2 is a plan view of an enlarged portion of the sub-line head 10. Note that FIG. 2 also illustrates a lens array described later.

The profile of the sub-line head 10 has a shape that is long in the y direction (a second direction) orthogonal to the x direction. The sub-line head 10 includes, for example, a circuit substrate unit 35 and an optical-element array provided on the circuit substrate unit 35. The optical-element array includes a plurality of two-dimensionally arranged light-emitting elements (optical elements) 20. The arrangement of the plurality of light-emitting elements 20 is, for example, a staggered arrangement. Specifically, these light-emitting elements 20 are two-dimensionally arranged in an oblique direction shifted from the x direction by a specified angle, and in the y direction. This arrangement can also be paraphrased as "non-orthogonal matrix arrangement".

The circuit substrate unit 35 includes a plurality of driver substrate elements 35a arranged in parallel with the y direction. As described later, the circuit substrate unit 35 constitutes a portion of a semiconductor wafer (a semiconductor substrate) that is a base substrate 30 (refer to FIG. 3). The driver substrate element 35a is formed to be long in parallel with the x direction. One light-emitting element 20 is implemented on each driver substrate element 35a. A pair of one driver substrate element 35a and one light-emitting element 20 constitutes a light-emitting source for one channel.

The light-emitting element 20 is constituted of an LED or a laser diode (LD). For example, the driver substrate elements 35a and the light-emitting elements 20 for several hundred to several thousand channels, or ten thousand or more channels are provided in one sub-line head 10. In one sub-line head 10, the light-emitting elements 20 are provided in, for example, four rows in the x direction, but they may be provided in three or less rows or in five or more rows.

The circuit substrate unit 35 includes a connection 34 that is provided, for example, at an end of the driver substrate element 35a, the connections 34 electrically connecting the driver substrate elements 35a in series. The connection 34 includes a plurality of electric wires such as, primarily, a power line and a data line.

Various known methods such as flip-chip mounting and wire bonding may be used as a method for implementing the light-emitting element 20 on the base substrate 30.

On all of the driver substrate elements 35a, the light-emitting elements 20 may be implemented at the same position in the x direction, that is, the light-emitting elements 20 may be implemented in only one column in the y direction. However, as described below, it is possible to design each lens 44 arranged on the light-emitting element 20 to have a large diameter, by implementing the respective light-emitting elements 20 such that a staggered arrangement in a plurality of columns is made in one sub-line head 10, as described above.

Figure 3:
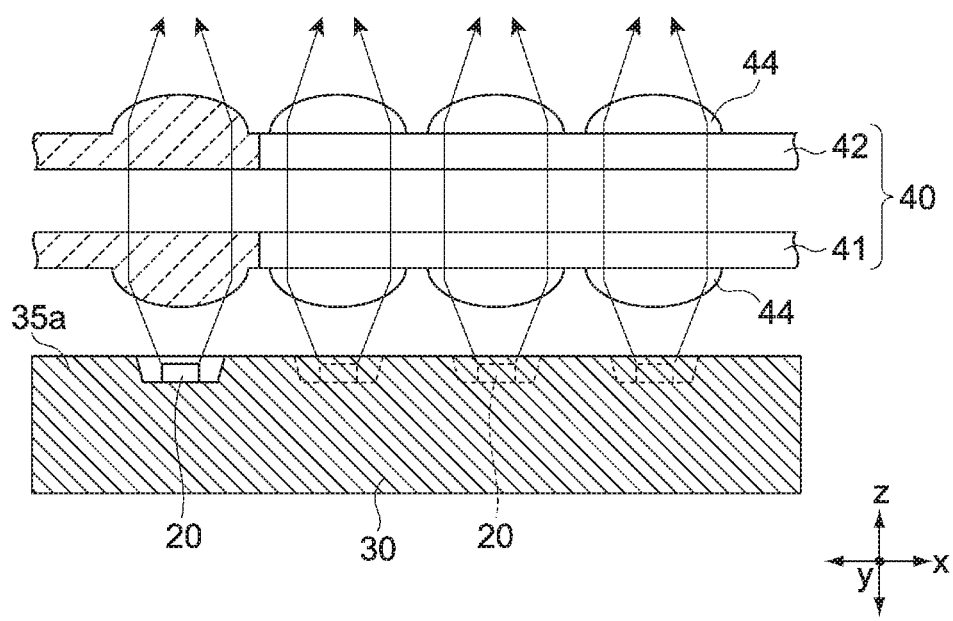
FIG. 3 is a cross-sectional view of the sub-line head.

FIG. 3 is a cross-sectional view of the sub-line head 10. The sub-line head 10 includes a lens array unit 40 that includes a plurality of lenses (microlens) 44 each arranged at a position corresponding to each of the plurality of light-emitting elements 20. The lens array unit 40 is provided for each sub-line head 10. The lens array unit 40 includes a first lens array 41 provided to be situated close to the circuit substrate unit 35, and a second lens array 42 provided to be situated distant from the circuit substrate unit 35. They constitute a collimating optical system. For example, the first lens array 41 is fixed to (the base substrate 30 including) the circuit substrate unit 35 with, for example, solder or an adhesive. For example, the second lens array 42 is fixed to a member that is not illustrated and is situated on an image-formation side.

When a configuration in which the light-emitting elements 20 are provided in a staggered arrangement, is compared with a configuration in which the light-emitting elements 20 are not provided in a staggered arrangement (for example, an optical-element array in one column in parallel with the y direction, or a non-orthogonal matrix arrangement) in the same implementation area in an x-y plane, it is possible to design the lens 44 to have as large a diameter as possible in the case of the staggered arrangement. This results in an increase in an amount of light emitted by the exposure head 150, and in being able to improve efficiency in the use of light.

Further, the capability of designing the lens 44 to have a large diameter also provides the following advantage when a collimating optical design is adopted. It becomes possible to relax the accuracy in a relative position adjustment between the first lens array 41 and the second lens array 42, which results in being able to easily produce the exposure head 150. In the case of a small lens diameter, there is a need for a high degree of accuracy in position adjustment, which results in increasing the difficulty in production.

The emission wavelength of the light-emitting element 20 is in the ultraviolet range, but the range can be changed as appropriate to, for example, the visible light range or the infrared range according to the application of the exposure head 150.

For reference, examples of design values for the size of the sub-line head 10 are described below, with reference to FIG. 2. These design values are merely examples, and can be changed as appropriate.

Pitch Pa of the light-emitting element 20 in the x direction: 70 µm

Pitch Pb of the light-emitting element 20 in the y direction: 70 µm

Pitch Pc of the driver substrate element 35a: 17.5 µm

Width Wa of the driver substrate element 35a in the y direction: 16.5 µm

Figure 4:
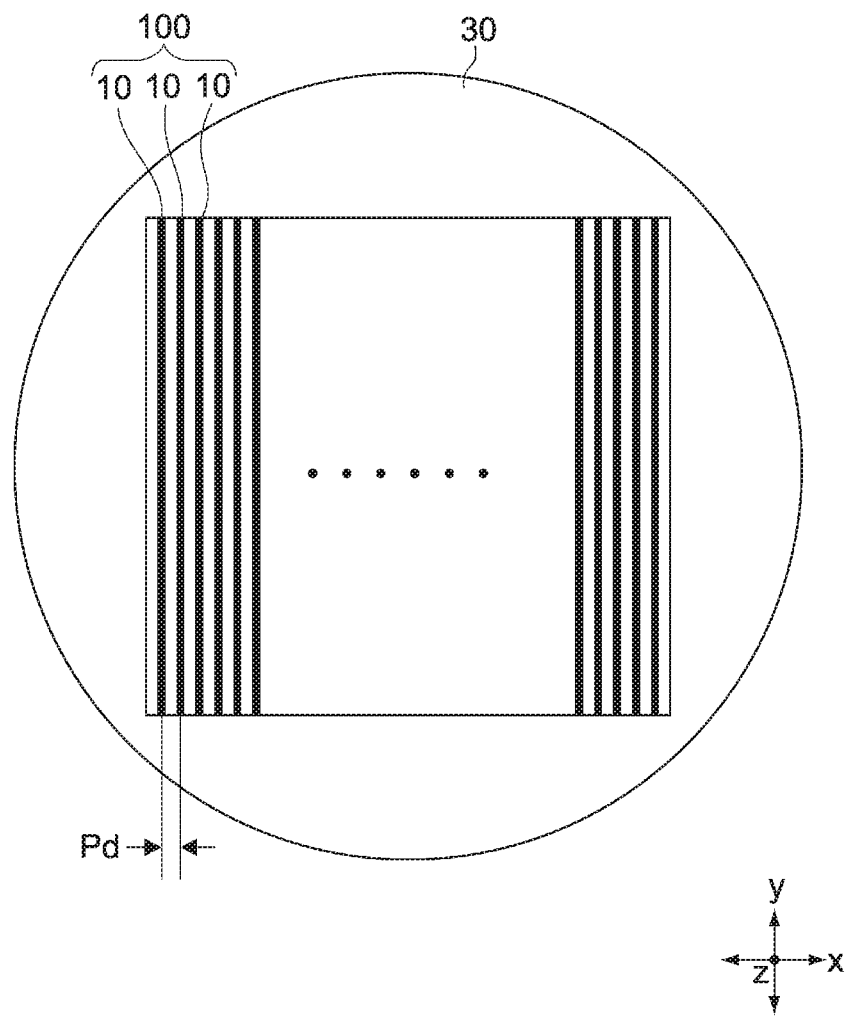
FIG. 4 is a plan view of the entirety of a base substrate of the line head.

Width Wb of the circuit substrate unit 35 (the driver substrate element 35a) in the x direction: 280 µm Length La of a side of the light-emitting element 20 (a square): 15 µm Diameter D of the lens 44: 60 µm 2. Base Substrate FIG. 4 is a plan view of the entirety of the base substrate 30 described above. The base substrate 30 is primarily constituted of a semiconductor wafer, as described above. This semiconductor wafer is provided with, for example, hundred sub-line heads 10. Specifically, each circuit substrate unit 35 is integrated with the semiconductor wafer by a semiconductor manufacturing process. Since the light-emitting element 20 is implemented on the circuit substrate unit 35 integrated with the semiconductor wafer as described above, it is possible to achieve more accurate positioning of dots with respect to the position of the light-emitting element 20. A pitch Pd of each sub-line head 10 is, for example, 1 mm. The semiconductor wafer has a diameter of, for example, eight inches.

As described above, it is possible to produce the circuit substrate units 35 of the sub-line head 10 in large numbers by a semiconductor manufacturing processing technology. The light-emitting element 20 is implemented on the circuit substrate unit 35. Then, the base substrate 30 is cut for each specified number of (for example, three) sub-line heads 10, and one line head 100 is produced for each of the specified numbers of sub-line heads 10.

3. Exposure Head Scanning Device (Optical Head Scanning Device)

An exposure head scanning device according to the present technology is applicable to, for example, a 3D printer or a maskless exposure device.

Figure 5:
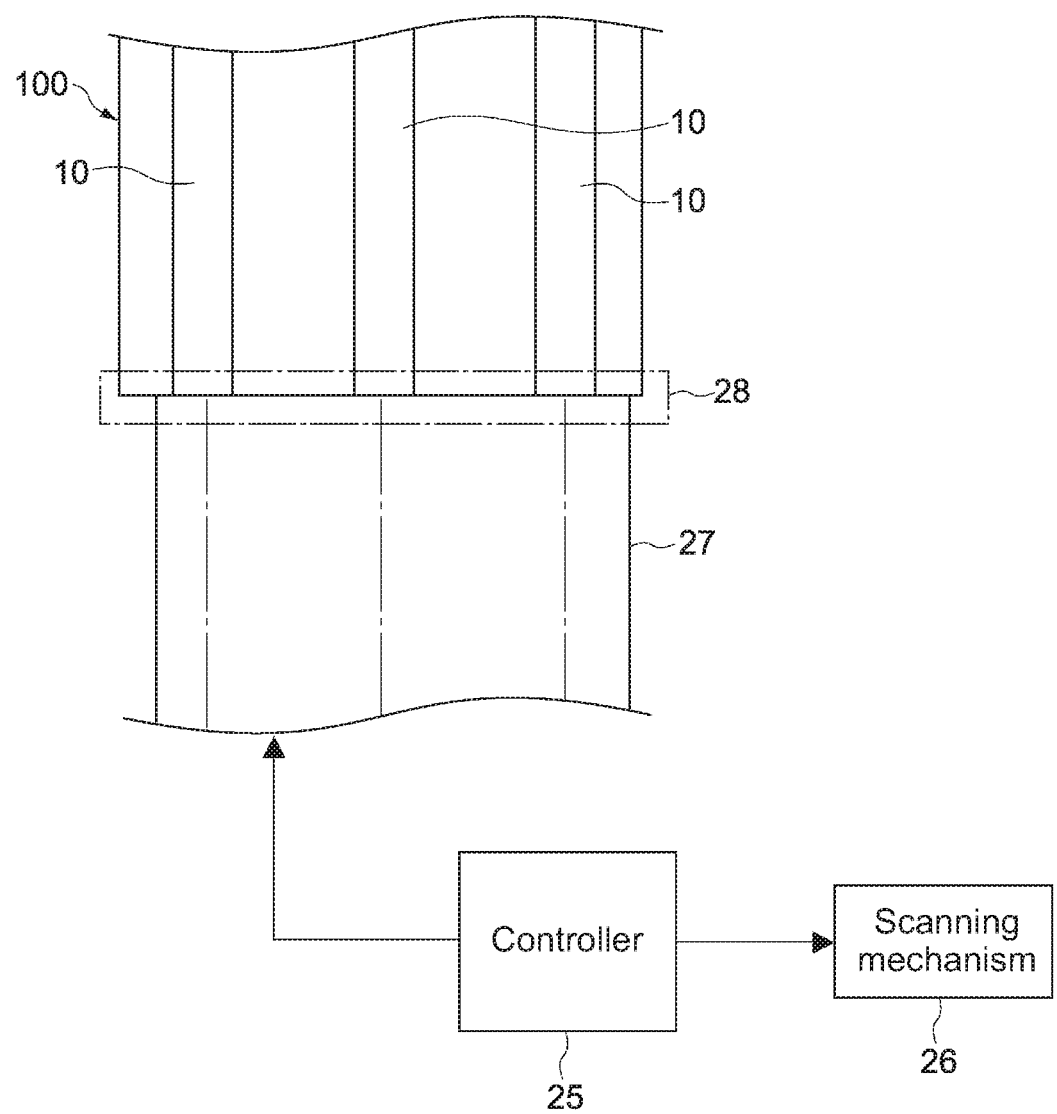
FIG. 5 is a block diagram of a configuration of an exposure head scanning device.

FIG. 5 is a block diagram of a configuration of the exposure head scanning device. An interface 28 is provided at an end of the line head 100, and a flexible printed circuit board 27 is connected to the line head 100 through the interface 28. A controller 25 is connected to the flexible printed circuit board 27. Control data (described later) generated by the controller 25 is input to the circuit substrate unit 35 of the line head 100 through the flexible printed circuit board 27 and the interface 28.

The controller 25 includes, for example, a central processing unit (CPU), a random access memory (RAM), and a read only memory (ROM). A programmable logic device (PLD) may be used instead of the CPU.

The exposure head scanning device includes a scanning mechanism 26 that scans the exposure head 150 in parallel with the x direction according to the control performed by the controller 25. The scanning mechanism 26 may use a known drive method such as ball screw drive, belt drive, or linear motor drive.

The control data output from the controller 25 is input to the line head 100 through the flexible printed circuit board 27 and the interface 28. Drive data primarily includes address data of each light-emitting element 20 (each driver substrate element 35a) and emission intensity data associated with the address data, the drive data including pieces of data that are serial in the order of the pieces of address data.

When control data is input to the circuit substrate unit 35, a driver substrate element 35a transfers the control data to a next driver substrate element 35a in a relay scheme. Then, a driver substrate element 35a of a last end channel discards the control data. Each driver substrate element 35a reads emission intensity data for its own address data, and causes a respective light-emitting element 20 to emit light according to the emission intensity data.

The interface 28 for output may also be provided in the driver substrate element 35a of a last end channel. This makes it possible to analyze output data to check states of the circuit substrate unit 35 and the light-emitting element 20, and the occurrence of a failure or the like.

A feature of the present technology is in that the controller 25 controls driving of the exposure head 150 and the scanning mechanism 26 such that the plurality of sub-line heads 10 is virtually used as one line head 100. For example, the controller 25 generates control data including address data of at least one channel (light-emitting element 20) to be invalidated from among respective light-emitting elements 20 of the line head 100, and outputs the control data. This enables the controller 25 to virtually use three sub-line heads 10 as one line head 100. The details are described below.

Figure 6:
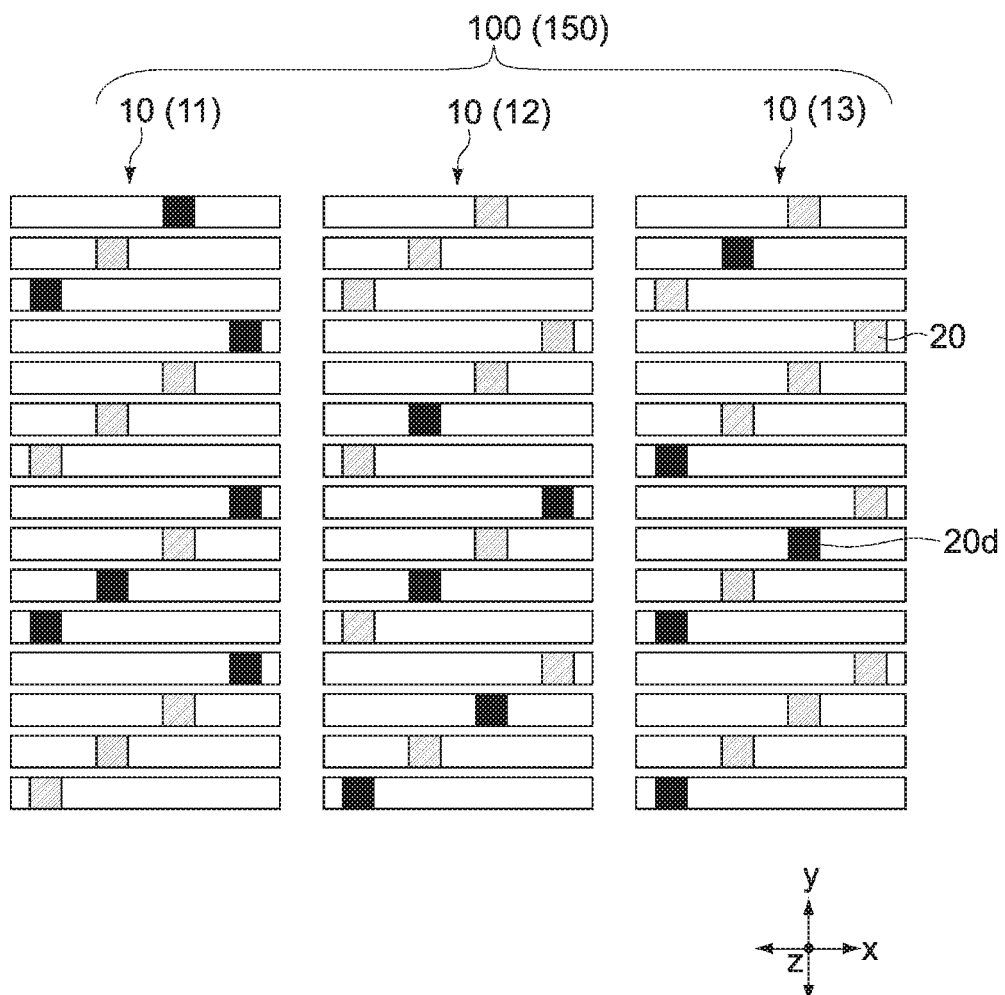
FIG. 6 schematically illustrates an example of normal lighting and the occurrence of a defect in each light-emitting element of three sub-line heads.

FIG. 6 schematically illustrates an example of normal lighting and the occurrence of a defect in each light-emitting element 20 of three sub-line heads 10. For example, a lighting state of a normally lighting up light-emitting element 20 is represented in grey (hatching), and a defective light-emitting element 20d is represented in black. It is known that, in the process of producing the line head 100, the light-emitting elements 20 of all of the channels in one sub-line head 10 can hardly be normally produced, and a defect occurs with a probability in a certain range. The probability that three identical channels in the three sub-line heads 10 (channels situated at the same position in the y direction) are all defective, is slight. If the defect probability is high, it is sufficient if a larger number of sub-line heads 10 are provided in one line head 100. The defect is confirmed by a check process in the process of producing the line head 100.

Figure 7:
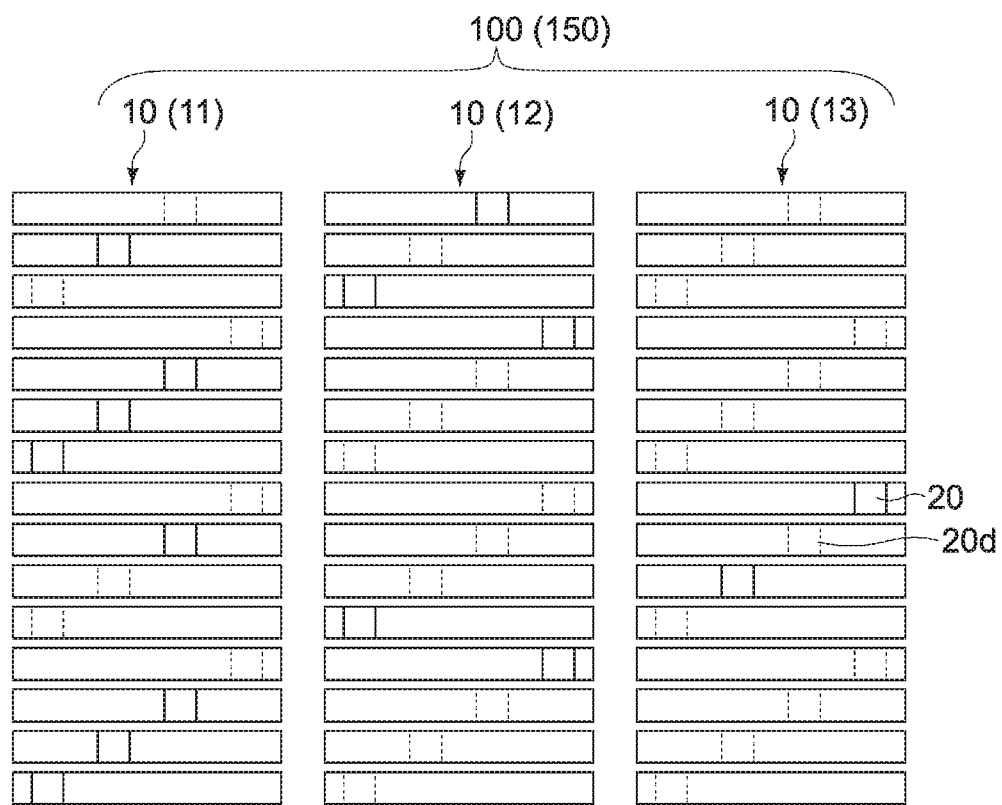
FIG. 7 illustrates light-emitting elements 20 to be invalidated of the three sub-line heads using broken lines.

FIG. 7 illustrates the light-emitting elements 20 to be invalidated using broken lines. In essence, a defective channel (the light-emitting element 20d) is invalidated. It is sufficient if one of the three identical channels in the three sub-line heads 10 is normal, and the other two channels are invalidated even if they are normal. The reason is that the three identical channels are virtually used as one channel. Control data including address data to be invalidated as described above, is input to each of the three sub-line heads 10.

In the following description, the three sub-line heads 10 are also conveniently referred to as a first sub-line head 11, a second sub-line head 12, and a third sub-line head 13 from the left in the figure.

4. Method for Driving Exposure Head Scanning Device 4.1) Drive Example 1

An example of driving the exposure head scanning device in which channels to be invalidated are those in the example illustrated in FIG. 7, is described below. FIGS. 8A, 8B, 8C, 9A, 9B, 9C, 10A, 10B, 10C, 11A, 11B, and 11C successively illustrate an operation of performing exposure on one line of an exposure target.

Here, an example of performing an exposure process while performing scanning by moving the exposure head 150 to the right, in the order of the third sub-line head 13, the second sub-line head 12, and the first sub-line head 11, is described. In this case, from among all of the channels in one sub-line head 10, exposure is successively performed starting from a channel in which the light-emitting element 20 is situated at a rightmost position. The long rectangular region boxed using a dot-dash line is a light-emitting element 20 that is now being used for exposure and is lighting up.

For facilitating the description, it is assumed that the sub-line head 10 includes fifteen channels in total. In the figure, the lowermost channel is a first channel, and the uppermost channel is a fifteen channel.

Further, it is necessary to pay attention to the fact that a non-lighting state of a light-emitting element 20 to be invalidated, and a non-lighting state with respect to a region on which exposure is intentionally not performed (the case in which the light-emitting element 20 can light up normally but the emission intensity of control data is zero) have different meanings. For facilitating the description, it is assumed that there is not a state in which the emission intensity is zero, and the light-emitting elements 20, which are not invalidated, all light up and exposure is performed.

Figure 8A:
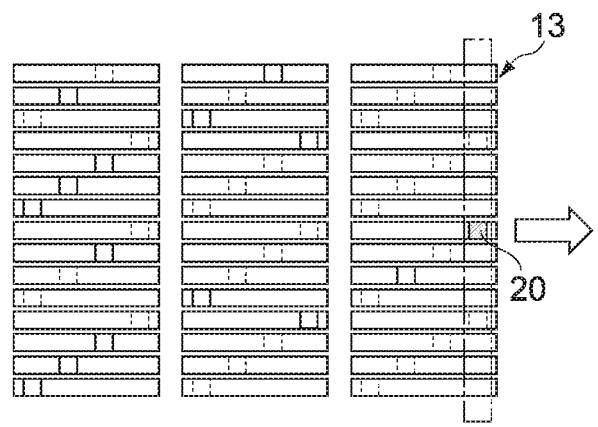
FIGS. 8A, 8B, and 8C successively illustrate an operation of performing exposure on one line of an exposure target.
Figure 8B:
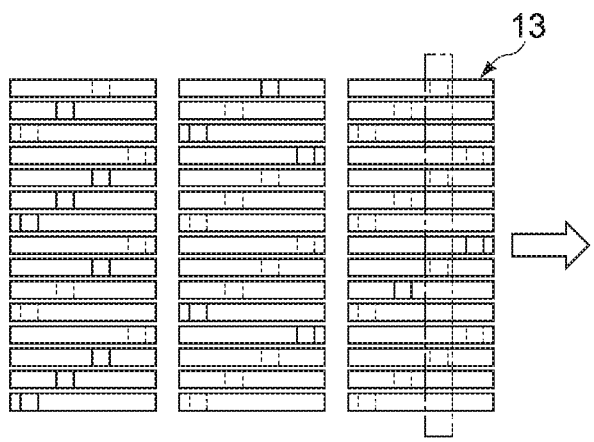
Figure 8C:
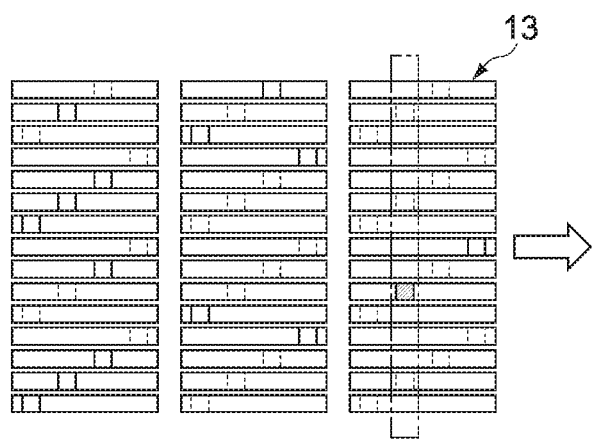
Figure 9A:
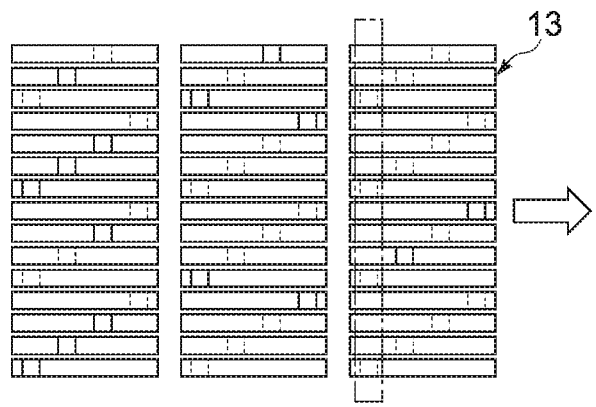
FIGS. 9A, 9B, and 9C successively illustrate the operation of performing exposure subsequent to C of FIG. 8C.
Figure 9B:
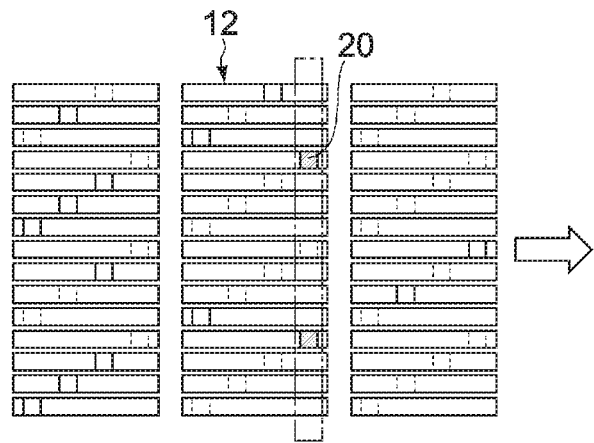
Figure 9C:
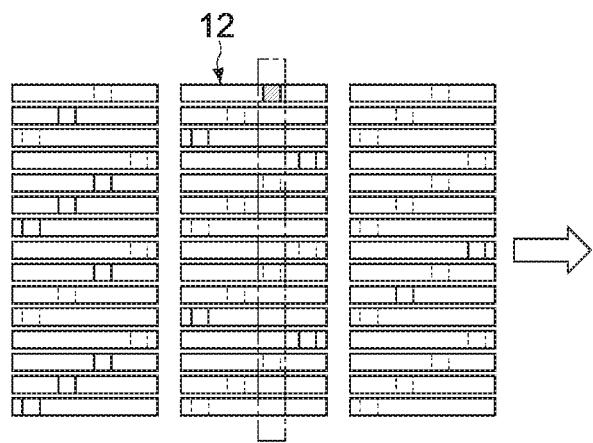
Figure 10A:
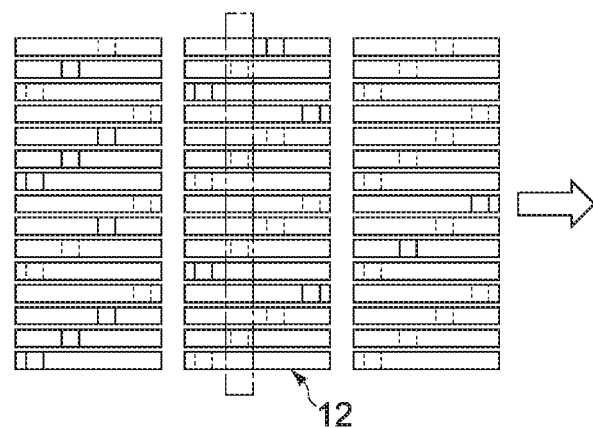
FIGS. 10A, 10B, and 10C successively illustrate the operation of performing exposure subsequent to C of FIG. 9C.
Figure 10B:
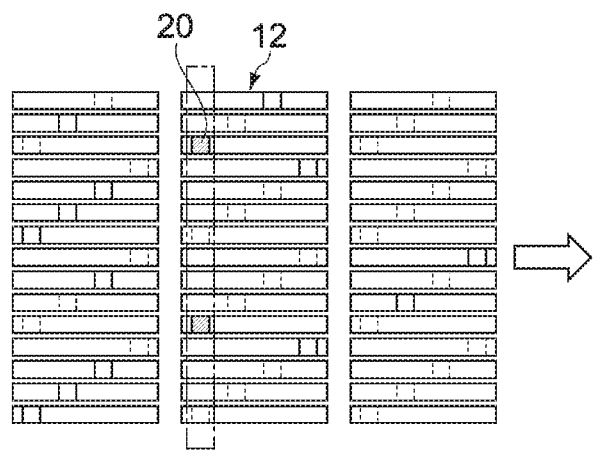
Figure 10C:
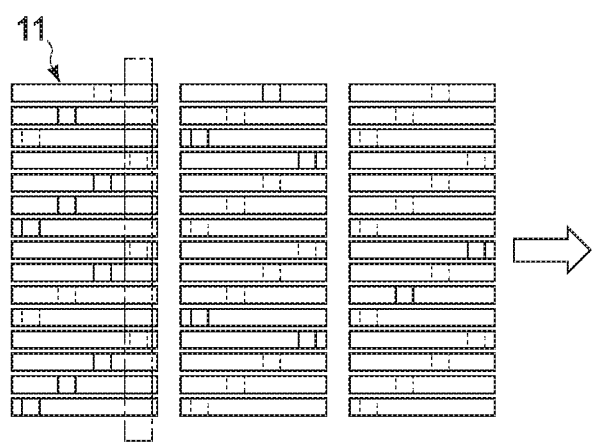

As illustrated in FIG. 8A, an eighth channel of the third sub-line head 13 lights up at the position of the exposure head 150 in the first step. As illustrated in FIG. 8B, all of the channels are invalidated at the position of the exposure head 150 in the next step, so exposure is not performed. As illustrated in FIG. 8C, a sixth channel lights up at the position of the exposure head 150 in the next step. As illustrated in FIG. 9A, all of the channels are invalidated at the position of the exposure head 150 in the next step, so exposure is not performed.

Figure 11A:
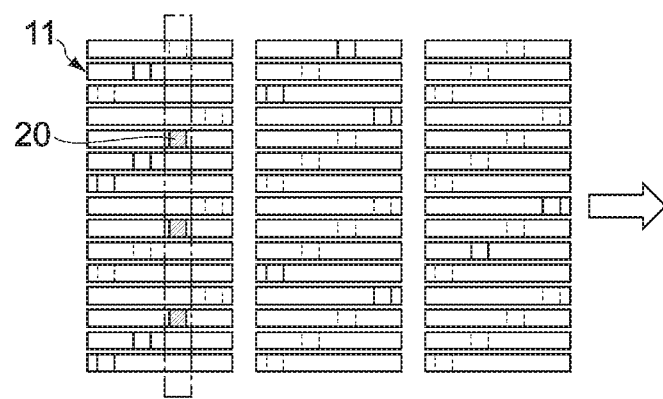
FIGS. 11A, 11B, and 11C successively illustrate the operation of performing exposure subsequent to C of FIG. 10C.
Figure 11B:
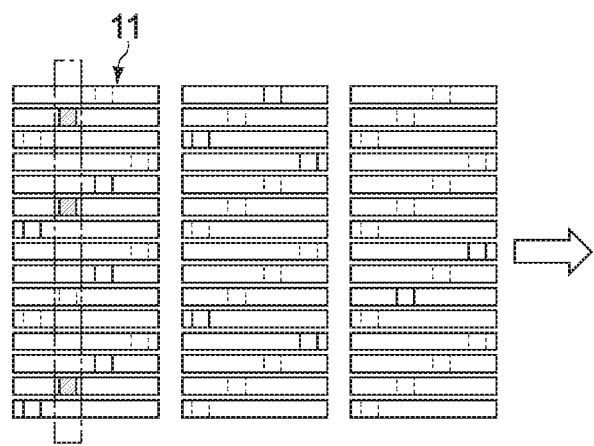
Figure 11C:
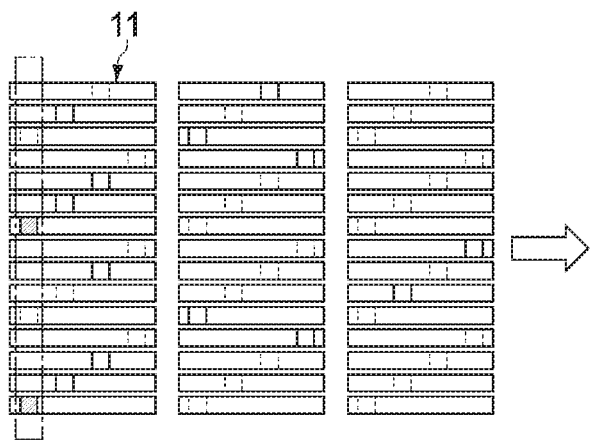
Figure 12A:
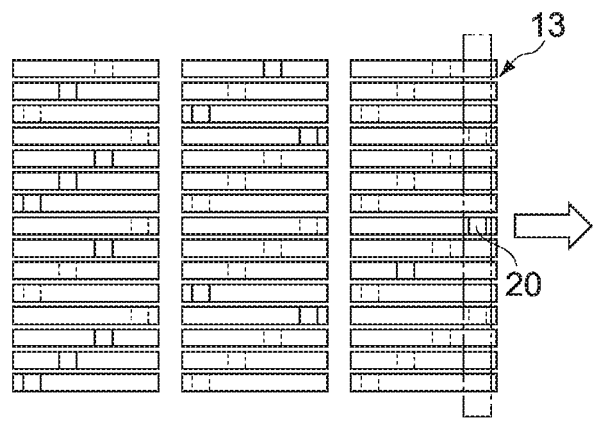
FIGS. 12A, 12B, and 12C successively illustrate another operation of performing exposure on one line of an exposure target.
Figure 12B:
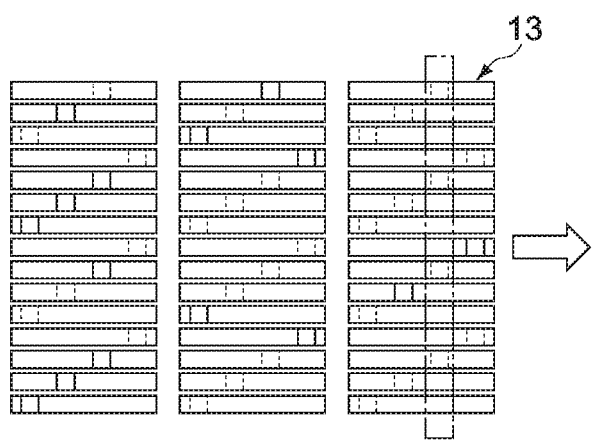
Figure 12C:
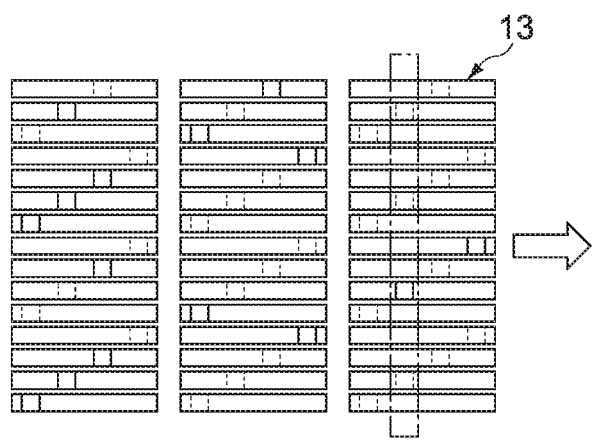
Figure 13A:
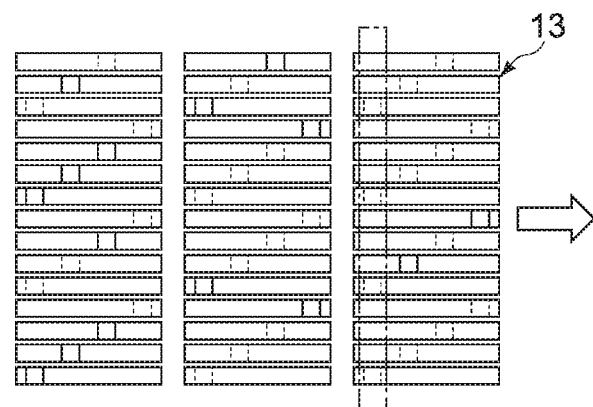
FIGS. 13A, 13B, and 13C successively illustrate the operation of performing exposure subsequent to C of FIG. 12C.
Figure 13B:
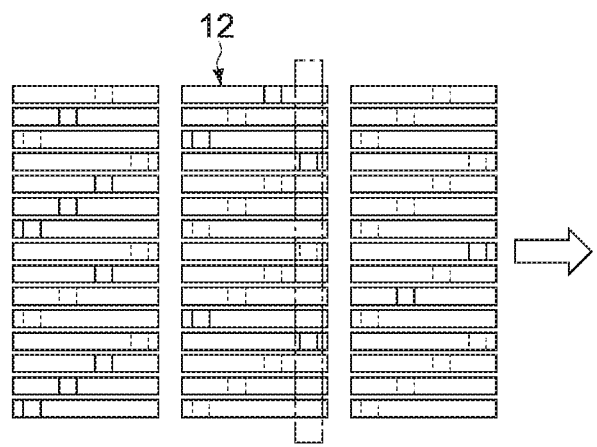
Figure 13C:
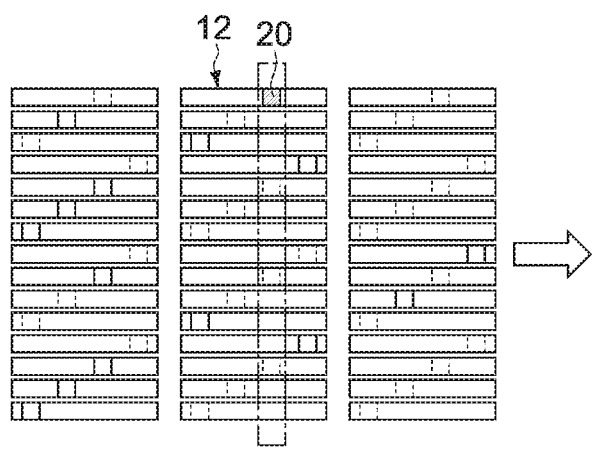
Figure 14A:
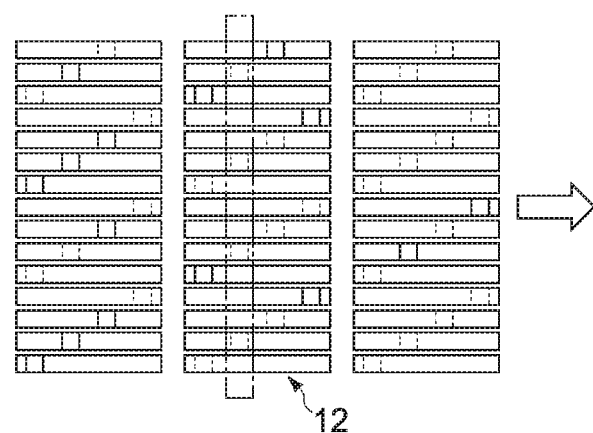
FIGS. 14A, 14B, and 14C successively illustrate the operation of performing exposure subsequent to C of FIG. 13C.
Figure 14B:
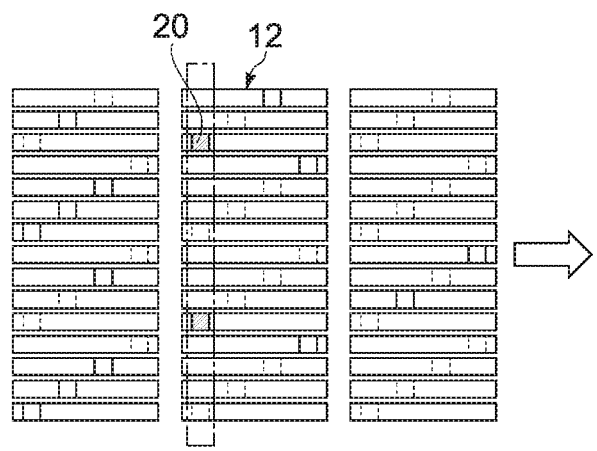
Figure 14C:
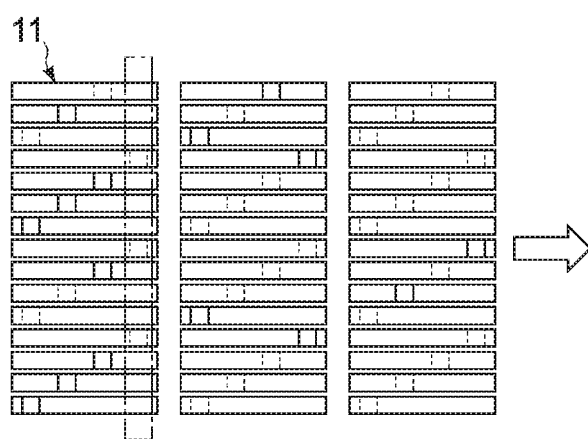
Figure 15A:
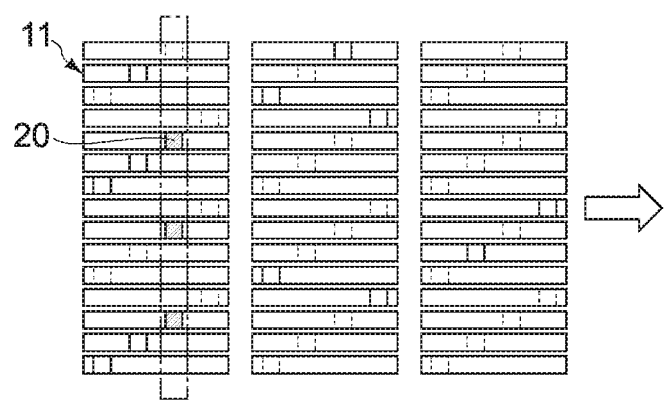
FIGS. 15A, 15B, and 15C successively illustrate the operation of performing exposure subsequent to C of FIG. 14C.
Figure 15B:
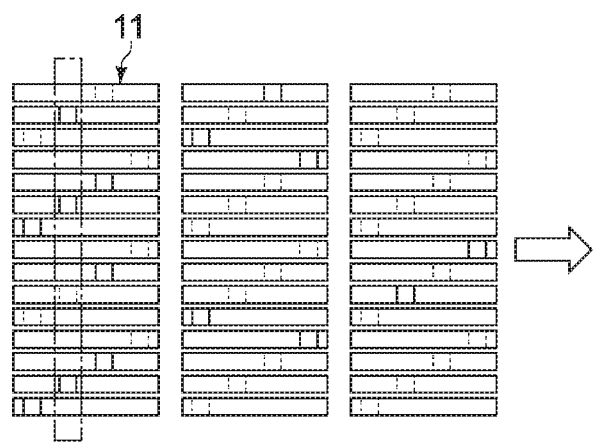
Figure 15C:
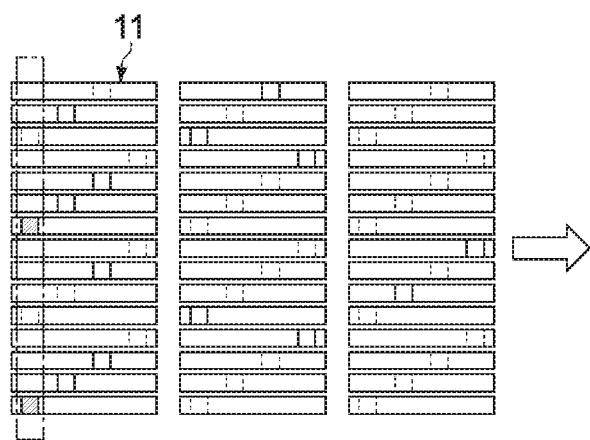

Regarding FIGS. 9B, 9C, 10A, 10B, 10C, 11A, 11B, and of FIG. 11C, scanning and exposure are similarly performed with respect to the second sub-line head 12 and the first sub-line head 11 in the remaining eight steps. At the position of the exposure head 150 illustrated in FIG. 11C, exposure has been virtually performed on all of the fifteen channels in the line head 100.

As described above, exposure performed on one line of the exposure target is completed with the twelve steps in total.

When it is a two-dimensional exposure target, the exposure head scanning device can perform exposure on its two-dimensional surface by the exposure head 150 being moved to a next line of the exposure target and by the operation of FIGS. 8A, 8B, 8C, 9A, 9B, 9C, 10A, 10B, 10C, 11A, 11B, and 11C being repeated.

In the description above, exposure is successively performed from the right side of the third sub-line head 13 to the left side of the first sub-line head 11. However, exposure may be successively performed from the left side of the first sub-line head 11 to the right side of the third sub-line head 13.

4.2) Drive Example 2

In Drive Example 1 described above, an example of performing exposure on all of the channels for one line with twelve steps (twelve columns), has been described. In Drive Example 2, an example of performing exposure on every other channel is successively illustrated in FIGS. 12A, 12B, 12C, 13A, 13B, 13C, 14A, 14B, 14C, 15A, 15B, and 15C.

5. Effects

As described above, the present technology makes it possible to virtually use a plurality of sub-line heads 10 as one line head 100. This results in being able to increase a production yield rate while maintaining non-defectiveness in the exposure head 150 of an end product. Further, even if a defect occurs in each light-emitting element 20, such a defect can be complemented, so the effect of there being no unnecessary sub-line head 10 is provided. Further, since an optical-element array is arranged on the circuit substrate unit 35 constituting a portion of the base substrate 30, it is possible to achieve more accurate positioning of dots with respect to the optical-element array.

6. Exposure Head According to Other Embodiments

Figure 16:
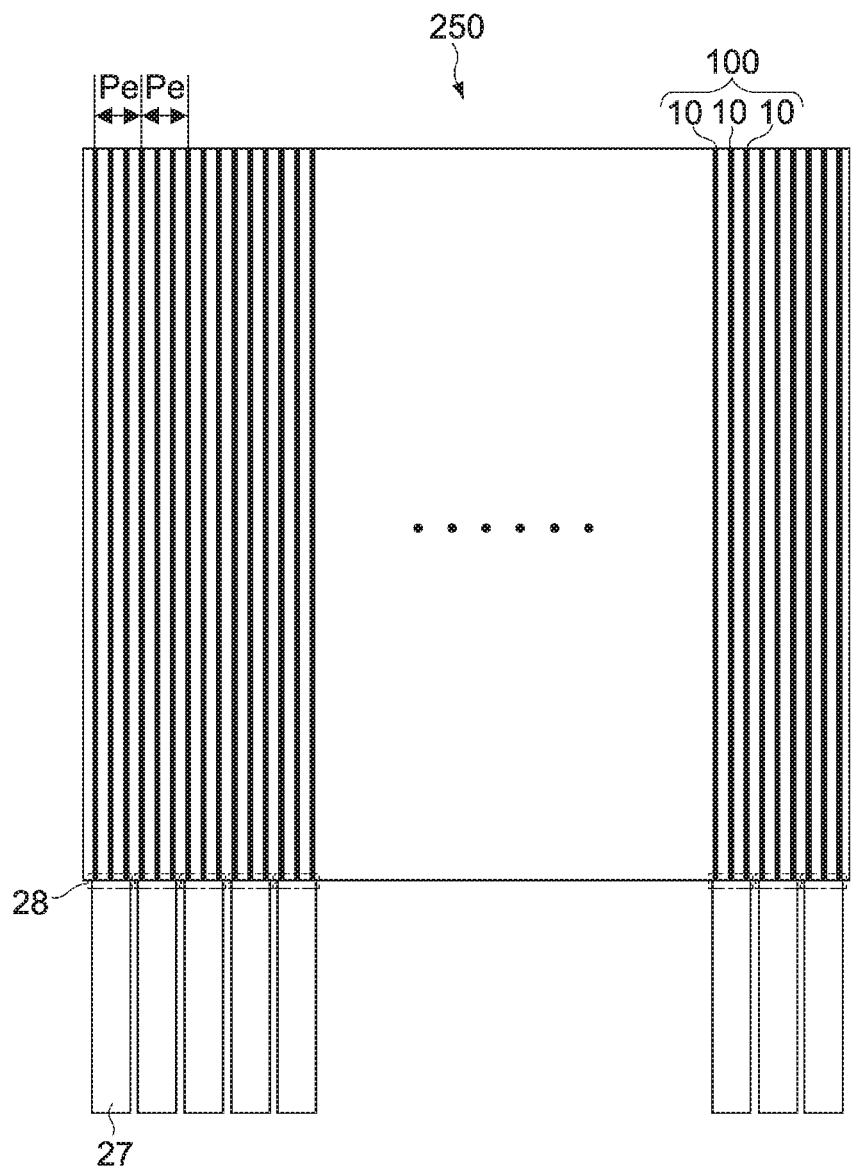
FIG. 16 is a plan view of an exposure head according to another embodiment.

FIG. 16 is a plan view of an exposure head 250 according to another embodiment of the present technology. In the following description, regarding, for example, a member and a function included in the exposure head 150 or in the exposure head scanning device according to the embodiment described above, a substantially similar element is denoted by the same reference symbol, a description thereof is simplified or omitted, and the description is made focused on a point of difference.

The exposure head 250 illustrated in FIG. 16 includes a surface light source (a surface light-emitting portion) provided with a plurality of line heads 100. In the exposure head 250, for example, the plurality of line heads 100 illustrated in FIG. 4 is used as the surface light source without any change. The flexible printed circuit board 27 is connected for each line head 100. The number of line heads 100 is not particularly limited as long as it is more than one, and the number of line heads 100 formed on a semiconductor substrate is used as the surface light source.

An exposure head scanning device that includes the exposure head 250 according to the present embodiment is capable of performing exposure on an exposure target surface having an area corresponding to the surface light source, for example, only by performing scanning in a range of a pitch Pe of three sub-line heads 10 (refer to FIGS. 8A, 8B, 8C, 9A, 9B, 9C, 10A, 10B, 10C, 11A, 11B, and 11C or FIGS. 12A, 12B, 12C, 13A, 13B, 13C, 14A, 14B, 14C, 15A, 15B, and 15C). This makes it possible to greatly reduce an exposure time.

Further, only mounting the lens array unit 40 without cutting the line head 100 formed on a semiconductor wafer, makes it possible to use this as the exposure head 250 of the surface light source without any change. This results in being able to reduce a process of producing the exposure head 250.

7. Other Various Embodiments

The present technology is not limited to the embodiments described above, and may achieve other various embodiments.

Regarding a lens array, a lens array may be used that includes a gradient index lens that uses, for example, a rod lens such as a SELFOC (registered trademark) lens 44, instead of the lens 44 of a collimating optical system in the embodiment described above.

In the description above, the exposure head 150 is taken as an example of an optical head, but the optical head may be a light-reception head. In the case of a light-reception head, a light-reception element such as a photo diode (PD) is used instead of the light-emitting element 20. Scanner equipment is taken as an example of an optical head scanning device including a light-reception head. Further, the light-reception head may constitute a surface light-reception portion, as illustrated in FIG. 16.

In the embodiment described above, the interface 28 for input to which the flexible printed circuit board 27 is connected, is provided only at one end of the line head 100. However, the interface 28 for input may be provided at both ends of the line head 100, and the flexible printed circuit board 27 may be connected at the both ends. In this case, the transmission through all of the channels of one sub-line head 10 is shared half-and-half. In other words, respective pieces of data input from respective interfaces 28 situated at the both ends are headed for a central channel of the sub-line head 10.

At least two of the features of the embodiments described above can also be combined.

Note that the present technology may also take the following configurations.

(1) An optical head including:
a base substrate; and
a line head that includes a plurality of sub-line heads electrically independent of one another and arranged on the base substrate in parallel with a first direction, each of the plurality of sub-line heads including a circuit substrate unit that constitutes a portion of the base substrate, and an optical-element array that includes a plurality of optical elements each arranged on the circuit substrate unit at least in parallel with a second direction that is a direction of a length of each of the plurality of sub-line heads.

(2) The optical head according to (1), in which
the optical-element array is configured such that the plurality of optical elements is provided in a staggered arrangement.

(3) The optical head according to (1) or (2), in which
the circuit substrate unit includes a plurality of driver substrate elements each arranged in parallel with the second direction correspondingly to each of the plurality of optical elements.

(4) The optical head according to (2), in which
the circuit substrate unit includes a plurality of driver substrate elements each arranged in parallel with the second direction correspondingly to each of the plurality of optical elements, and
each of the plurality of driver substrate elements is formed to be long in the first direction.

(5) The optical head according to claim 3) or (4), in which
the base substrate is constituted of a semiconductor substrate, and
the plurality of driver substrate elements is integrated with the semiconductor substrate.
(6) The optical head according to any one of (1) to (5), in which
the line head includes a lens array that includes a plurality of lenses each arranged at a position corresponding to each of the plurality of optical elements.
(7) The optical head according to (6), in which
a plurality of the lens arrays is provided and constitutes a collimating optical system.
(8) The optical head according to any one of (1) to (5), in which
the line head includes a lens array that is arranged on the plurality of optical elements and includes a gradient index lens.
(9) The optical head according to any one of (1) to (8), further including
an interface that is configured such that data indicating at least one optical element to be invalidated from among the plurality of optical elements is input to each of the circuit substrate units.
(10) The optical head according to any one of (1) to (9), in which
a plurality of the line heads is provided and constitutes a surface light-emitting portion or a surface light-reception portion.
(11) An optical head scanning device including:
an optical head that includes a base substrate, and a line head that includes a plurality of sub-line heads electrically independent of one another and arranged on the base substrate in parallel with a first direction, each of the plurality of sub-line heads including a circuit substrate unit that constitutes a portion of the base substrate, and an optical-element array that includes a plurality of optical elements each arranged on the circuit substrate unit at least in parallel with a second direction that is a direction of a length of each of the plurality of sub-line heads;
a scanning mechanism that scans the optical head in parallel with the first direction; and
a controller that controls driving of the optical head and the scanning mechanism using data indicating at least one optical element to be invalidated from among the plurality of optical elements, such that the plurality of sub-line heads is virtually used as one line head.
(12) The optical head scanning device according to (11), in which
the controller is configured to use a normal optical element arranged at a position identical, in the second direction, to a position of a defective optical element of a first sub-line head from among the plurality of sub-line heads, the normal optical element being an optical element of the second sub-line head.
(13) The optical head scanning device according to (11) or (12), in which
a plurality of the line heads is provided and constitutes a surface light-emitting portion or a surface light-reception portion.
(14) A method for driving an optical head scanning device that includes an optical head, and a scanning mechanism that scans the optical head in parallel with a first direction, the optical head including a base substrate, and a line head that includes a plurality of sub-line heads electrically independent of one another and arranged on the base substrate in parallel with a first direction, each of the plurality of sub-line heads including a circuit substrate unit that constitutes a portion of the base substrate, and an optical-element array that includes a plurality of optical elements each arranged on the circuit substrate unit at least in parallel with a second direction that is a direction of a length of each of the plurality of sub-line heads, the method including:
generating data indicating at least one optical element to be invalidated from among the plurality of optical elements; and controlling driving of the optical head and the scanning mechanism using the acquired data, such that the plurality of sub-line heads is virtually used as one line head.

REFERENCE SIGNS LIST

10 sub-line head
11 first sub-line head
12 second sub-line head
13 third sub-line head
20 light-emitting element
20 controller
25 scanning mechanism
26 flexible printed circuit board
27 interface
28 base substrate
30 circuit substrate unit
35a driver substrate element
40 lens array unit
41, 42 lens array
44 lens
100 line head
150, 250 exposure head

The invention claimed is:
1. An optical head, comprising:
a base substrate; and
a line head that includes a plurality of sub-line heads on the base substrate, wherein
sub-line heads of the plurality of sub-line heads are electrically independent of one another,
an arrangement of the plurality of sub-line heads on the base substrate is parallel to a first direction on the base substrate,
each sub-line head of the plurality of sub-line heads includes a circuit substrate unit and an optical-element array,
the base substrate includes the circuit substrate unit,
the circuit substrate unit includes a plurality of driver substrate elements,
a length of each driver substrate element of the plurality of driver substrate elements in the first direction is longer than a length of each driver substrate element of the plurality of driver substrate elements in a second direction on the base substrate,
the optical-element array includes a plurality of optical elements,
an arrangement of each optical element of the plurality of optical elements on the circuit substrate unit is parallel to the second direction, and
a length of each sub-line head of the plurality of sub-line heads in the second direction is longer than a length of each sub-line head of the plurality of sub-line heads in the first direction.
2. The optical head according to claim 1, wherein the plurality of optical elements is in a staggered arrangement.

3. The optical head according to claim 1, wherein
each driver substrate element of the plurality of driver substrate elements corresponds to a respective optical element of the plurality of optical elements, and
an arrangement of the plurality of driver substrate elements on the circuit substrate unit is parallel to the second direction.

4. The optical head according to claim 3, wherein
the base substrate includes a semiconductor substrate, and
the plurality of driver substrate elements is integrated with the semiconductor substrate.

5. The optical head according to claim 1, wherein
the line head further includes a lens array,
the lens array includes a plurality of lenses, and
a position of each lens of the plurality of lenses corresponds to a position of a respective optical element of the plurality of optical elements.

6. The optical head according to claim 5, wherein
the line head further includes a collimating optical system, and
the collimating optical system includes a plurality of lens arrays including the lens array.

7. The optical head according to claim 1, wherein
the line head further includes a lens array on the plurality of optical elements, and
the lens array includes a gradient index lens.

8. The optical head according to claim 1, further comprising an interface configured to input data to the circuit substrate unit of each sub-line head of the plurality of sub-line heads, wherein
the data indicates at least one optical element to be invalidated from the plurality of optical elements.

9. The optical head according to claim 1, further comprising a plurality of line heads that corresponds to one of a surface light-emitting portion or a surface light-reception portion of the optical head.

10. An optical head scanning device, comprising:
an optical head that includes:
a base substrate; and
a line head that includes a plurality of sub-line heads on the base substrate, wherein
sub-line heads of the plurality of sub-line heads are electrically independent of one another,
an arrangement of the plurality of sub-line heads on the base substrate is parallel to a first direction on the base substrate,
each sub-line head of the plurality of sub-line heads includes a circuit substrate unit and an optical-element array,
the base substrate includes the circuit substrate unit,
the circuit substrate unit includes a plurality of driver substrate elements,
a length of each driver substrate element of the plurality of driver substrate elements in the first direction is longer than a length of each driver substrate element of the plurality of driver substrate elements in a second direction on the base substrate,
the optical-element array includes a plurality of optical elements,
an arrangement of each optical element of the plurality of optical elements on the circuit substrate unit is parallel to the second direction, and
a length of each sub-line head of the plurality of sub-line heads in the second direction is longer than a length of each sub-line head of the plurality of sub-line heads in the first direction;
a scanning mechanism configured to scan the optical head in parallel to the first direction; and
a controller configured to control each of a driving operation of the optical head and the scanning mechanism, to virtually utilize the plurality of sub-line heads as one line head, wherein
each of the driving operation and the scanning mechanism is controlled based on data, and
the data indicates at least one optical element to be invalidated from the plurality of optical elements.

11. The optical head scanning device according to claim 10, wherein
the controller is further configured to utilize a normal optical element,
the normal optical element is at a position identical to a position of a defective optical element in the second direction,
the plurality of optical elements of a first sub-line head of the plurality of sub-line heads includes the defective optical element, and
the plurality of optical elements of a second sub-line head of the plurality of sub-line heads includes the normal optical element.

12. The optical head scanning device according to claim 10, further includes a plurality of line heads that corresponds to one of a surface light-emitting portion or a surface light-reception portion of the optical head.

13. A method for driving an optical head scanning device, comprising:
generating data indicating at least one optical element to be invalidated from a plurality of optical elements of an optical-element array of a sub-line head of a plurality of sub-line heads, wherein
the optical head scanning device includes an optical head and a scanning mechanism,
the scanning mechanism is configured to scan the optical head in parallel with a first direction,
the optical head includes:
a base substrate, and
a line head that includes the plurality of sub-line heads on the base substrate,
sub-line heads of the plurality of sub-line heads are electrically independent of one another,
an arrangement of the plurality of sub-line heads on the base substrate is parallel to the first direction on the base substrate,
each sub-line head of the plurality of sub-line heads includes a circuit substrate unit and the optical-element array,
the base substrate includes the circuit substrate unit,
the circuit substrate unit includes a plurality of driver substrate elements,
a length of each driver substrate element of the plurality of driver substrate elements in the first direction is longer than a length of each driver substrate element of the plurality of driver substrate elements in a second direction on the base substrate,
an arrangement of each optical element of the plurality of optical elements on the circuit substrate unit is parallel to the second direction, and
a length of each sub-line head of the plurality of sub-line heads in the second direction is longer than a length of each sub-line head of the plurality of sub-line heads in the first direction; and
controlling each of a driving operation of the optical head and the scanning mechanism based on the generated data, wherein each of the driving operation and the scanning mechanism is controlled to virtually utilize the plurality of sub-line heads as one line head.

* * * * *